United States Patent
Siemieniec et al.

(10) Patent No.: US 9,111,766 B2
(45) Date of Patent: Aug. 18, 2015

(54) TRANSISTOR DEVICE WITH A FIELD ELECTRODE

(71) Applicant: Infineon Technologies Austria AG, Villach (AT)

(72) Inventors: Ralf Siemieniec, Villach (AT); Oliver Blank, Villach (AT)

(73) Assignee: INFINEON TECHNOLOGIES AUSTRIA AG, Villach (AT)

( * ) Notice: Subject to any disclaimer, the term of this patent is extended or adjusted under 35 U.S.C. 154(b) by 0 days.

(21) Appl. No.: 14/034,782

(22) Filed: Sep. 24, 2013

(65) Prior Publication Data

US 2015/0084121 A1    Mar. 26, 2015

(51) Int. Cl.

| H01L 29/76 | (2006.01) |
|---|---|
| H01L 29/94 | (2006.01) |
| H01L 31/062 | (2012.01) |
| H01L 31/113 | (2006.01) |
| H01L 31/119 | (2006.01) |
| H01L 29/06 | (2006.01) |
| H01L 29/78 | (2006.01) |
| H01L 29/66 | (2006.01) |

(52) U.S. Cl.
CPC ...... *H01L 29/0623* (2013.01); *H01L 29/66734* (2013.01); *H01L 29/7813* (2013.01)

(58) Field of Classification Search
CPC .............. H01L 27/10823; H01L 27/10838; H01L 27/10876; H01L 29/1037; H01L 29/42352; H01L 29/42356; H01L 29/4236; H01L 29/66704; H01L 29/6673; H01L 29/7813; H01L 29/7825

USPC ........... 257/328, 329, 330, 331, 332, E27.091
See application file for complete search history.

(56) References Cited

U.S. PATENT DOCUMENTS

| 6,710,403 B2 | 3/2004 | Sapp | |
|---|---|---|---|
| 2012/0025304 A1 | 2/2012 | Blank et al. | |
| 2012/0261746 A1* | 10/2012 | Darwish et al. | 257/330 |
| 2014/0203356 A1* | 7/2014 | Kagata et al. | 257/330 |

FOREIGN PATENT DOCUMENTS

| DE | 102006049043 A1 | 4/2008 |
|---|---|---|
| DE | 102005009000 B4 | 4/2009 |

* cited by examiner

*Primary Examiner* — Hoai V Pham
(74) *Attorney, Agent, or Firm* — Murphy, Bilak & Homiller, PLC (57) ABSTRACT

A transistor device includes a source region, a drift region, and a body region arranged between the source region and the drift region. A gate electrode is adjacent to the body region, and dielectrically insulated from the body region by a gate dielectric. A field electrode arrangement is adjacent to the drift region and the body region, spaced apart from the gate electrode in a first direction that is perpendicular to a vertical direction in which the source region and the drift region are spaced apart, and includes a field electrode and a field electrode dielectric. The field electrode dielectric dielectrically insulates the field electrode at least from the drift region. The field electrode arrangement has a first width adjacent the drift region, and a second width adjacent the body region and the first width is larger than the second width.

10 Claims, 6 Drawing Sheets

TRANSISTOR DEVICE WITH A FIELD ELECTRODE

TECHNICAL FIELD

Embodiments of the present invention relate to a transistor device, in particular a transistor device with a field electrode.

BACKGROUND

Transistors, in particular MOS (Metal-Oxide-Semiconductor) transistors, such as MOSFETs (Metal-Oxide-Semiconductor Field-Effect Transistors) or IGBTs (Insulated Gate Bipolar Transistors) are widely used as electronic switches in a variety of different applications, such as drive applications, power conversion applications, automotive applications, consumer electronic applications, and the like. It is desirable for those transistors to have a predefined voltage blocking capability, which is dependent on the specific application, and to have a low on-resistance, which is the electrical resistance of the transistor in an on-state.

MOS transistors used as electronic switches (that are often referred to as power MOS transistors) include a drift region between a body region and drain region (also referred to as emitter region in an IGBT). The on-resistance and the voltage blocking capability of the transistor device is mostly defined by a length of this drift region between the body region and the drain region, and the doping concentration of this drift region. In general, the on-resistance decreases as the doping concentration increases and/or as the length decreases. However, an increased doping concentration and/or a decreased length may cause a decreased voltage blocking capability.

One way to increase the voltage blocking capability without increasing the on-resistance is to provide a field electrode adjacent the drift region, dielectrically insulated from the drift region, and coupled to a source terminal of the MOS transistor. Usually, a power transistor includes a plurality of transistor cells connected in parallel, with each of these transistor cells including a field electrode, and a drift region between two adjacent field electrodes.

There is a need to provide a transistor device that includes a field electrode, and that has a reduced size.

SUMMARY

One embodiment relates to a transistor device. The transistor device includes a source region, a drift region, a body region arranged between the source region and the drift region, a gate electrode adjacent the body region, and dielectrically insulated from the body region by a gate dielectric, and a field electrode arrangement. The field electrode arrangement is adjacent the drift region and the body region, is spaced apart from the gate electrode in a first direction that is perpendicular to a vertical direction in which the source region and the drift region are spaced apart, and includes a field electrode, and a field electrode dielectric. The field electrode dielectric dielectrically insulates the field electrode at least from the drift region. The field electrode arrangement has a first width adjacent the drift region, and a second width adjacent the body region, wherein the first width is larger than the second width.

Another embodiment relates to a method for forming a transistor device. The method includes forming a field electrode arrangement by forming a trench in a first surface of a semiconductor body, forming a protection layer on sidewalls of the trench in an upper trench section, forming a dielectric layer on a bottom of the trench and on sidewall sections uncovered by the protection layer, and forming a field electrode at least on the dielectric layer. The method further includes forming a gate electrode and a gate electrode dielectric horizontally spaced apart from the field electrode arrangement with respect to the first surface, forming a body region adjacent the gate electrode and dielectrically insulated from the gate electrode by the gate dielectric, and forming a source region in the body region.

BRIEF DESCRIPTION OF THE DRAWINGS

Examples are explained below with reference to the drawings. The drawings serve to illustrate the basic principles of embodiments disclosed herein, so that only aspects necessary for understanding the basic principles are illustrated. The drawings are not to scale. In the drawings the same reference characters denote like features.

DETAILED DESCRIPTION

In the following detailed description, reference is made to the accompanying drawings. The drawings form a part of the description and by way of illustration show specific embodiments in which the invention may be practiced. It is to be understood that the features of the various embodiments described herein may be combined with each other, unless specifically noted otherwise.

Figure 1:
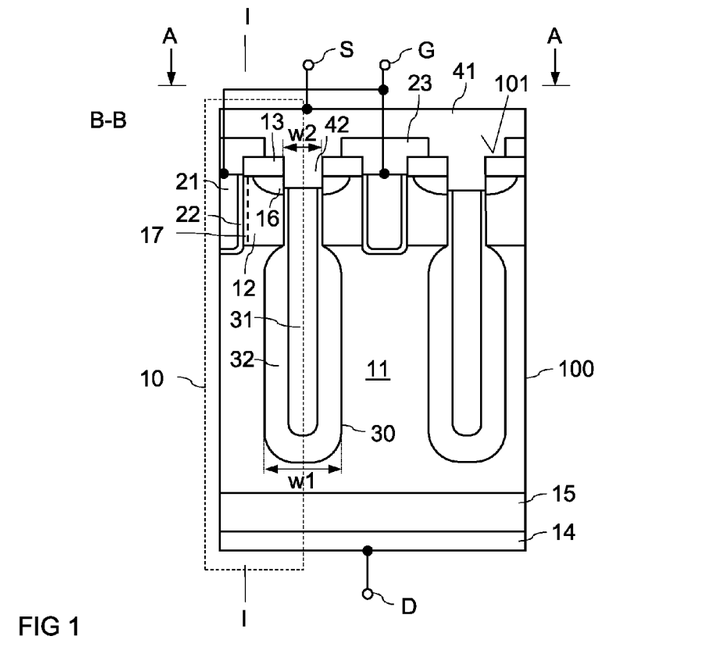
FIG. 1 shows a vertical cross sectional view of a transistor device according to one embodiment.

FIG. 1 shows a vertical cross sectional view of a transistor device according to one embodiment. The transistor device includes a semiconductor body 100 with a first surface 101. The vertical section plane shown in FIG. 1 is a section plane perpendicular to this first surface 101. The semiconductor body 100 may include a conventional semiconductor material, such as silicon (Si), silicon carbide (SiC), gallium arsenide (GaAs), gallium nitride (GaN), or the like.

Referring to FIG. 1, the transistor device includes, in the semiconductor body 100, a source region 13, a drift region 11, and a body region 12 arranged between a source region 13 and the drift region 11. A gate electrode 21 is adjacent the body region 12, and is dielectrically insulated from the body region 12 by a gate dielectric 22. In the present embodiment, the gate electrode 21 is implemented as a trench electrode that is arranged in a trench extending from the source region 13 through the body region 12 to or into the drift region 11. The gate electrode 21 serves to control a conducting channel in the body region 12 between the source region 13 and the drift region 11. The transistor device further includes a drain region 14 separated from the body region 12 by the drift region 11. Optionally, a field stop region 15 is arranged between the drift region 11 and the drain region 14.

Referring to FIG. 1, the transistor device further includes a field electrode arrangement 30. The field electrode arrangement 30 is adjacent the drift region 11, and the body region 13, and is spaced apart from the gate electrode 21 in a first direction. This first direction is a horizontal direction in the present embodiment, and is perpendicular to a vertical direction in which the source region 13 and the drift region 11 are spaced apart. The field electrode arrangement 30 includes a field electrode 31, and a field electrode dielectric 32. The field electrode dielectric 32 dielectrically insulates the field electrode 31 at least from the drift region 11. In the embodiment shown in FIG. 1, the field electrode dielectric 32 also dielectrically insulates the field electrode 31 from the body region 12.

The field electrode arrangement 30 has a first width w1 adjacent the drift region 11, and a second width w2 adjacent the body region 12, wherein the first width w1 is larger than the second width w2. According to one embodiment, the second width w2 is smaller than 60% of the first width w1.

In the embodiment shown in FIG. 1, the smaller second width w2 adjacent the body region 12 is obtained by the field electrode dielectric 32 having a smaller thickness adjacent the body region 12 than adjacent the drift region 11. The field electrode dielectric 32 has a first thickness adjacent the drift region 11, and a second thickness adjacent the body region 12, wherein the second thickness is smaller than the first thickness. According to one embodiment, the second thickness is less than 50% of the first thickness, and may further be less than 30% of the first thickness. The transistor device is not restricted to have a smaller thickness of the field electrode dielectric 32 adjacent the body region. There are also other ways to implement the field electrode arrangement with a larger width w1 adjacent the drift region 11 than adjacent the body region 12. Some of these ways are explained herein below.

According to one embodiment, the transistor device includes a plurality of transistor cells 10, wherein each transistor cell includes a source region 13, a body region 12, a drift region 11, a drain region 14, a gate electrode 21 with a gate dielectric 22, and a field electrode arrangement 30. Referring to FIG. 1, two neighboring transistor cells may share one gate electrode 21, and two other neighboring transistor cells may share one field electrode arrangement 30. Further, the individual transistor cells may share the drift region 11 and the drain region 14. The individual transistor cells are connected in parallel by having the source regions 13, and the body regions 12 connected to a source terminal S, by having the individual gate electrodes 21 connected to a gate terminal G, and by having the (common) drain region 14 connected to a drain terminal D.

The transistor device can be implemented as an n-type transistor device or as a p-type transistor device. In an n-type transistor device, the source region 13, and the drift region 11 are n-doped, and the body region 12 is p-doped. In a p-type transistor device, the source region 13, and the drift region 11 are p-doped, and the body region 12 is n-doped. Further, the transistor device could either be implemented as a MOSFET, or as an IGBT. In a MOSFET, the drain region 14 has the same doping type as the drift region 11, and is more highly doped than the drift region 11. In an IGBT, the drain region 14 has a doping type that is complementary to the doping type of the drift region 11 (in an IGBT, the drain region is also referred to as emitter region).

Further, the transistor device can be implemented as an enhancement-type (normally-off) transistor device, or as a depletion-type (normally-on) transistor device. In an enhancement-type transistor device, the body region 12 adjoins the gate dielectric 22, so that in an on-state of the transistor device the gate electrode 21 generates an inversion channel along the gate dielectric 22 between the source region 13 and the drift region 11. In a depletion-type transistor device, the body region 12 includes a channel region 17 (illustrated in dashed lines in FIG. 1) of a doping type complementary to the doping type of the body region 12 along the gate dielectric 22 between the source region 13 and the drift region 11. In this case, the transistor device can be switched off by controlling the gate electrode 21 such that the channel region 17 is depleted of charge carriers.

The transistor device shown in FIG. 1 can be operated like a conventional MOS-transistor. That is, the transistor device can be switched on and off by suitably controlling a drive potential applied to the gate terminal G, and the gate electrode 21, respectively. The transistor device is in an on-state, when there is a conducting channel in the body region 12 along the gate dielectric 22 between the source region 13 and the drift region 11. In this case, a current can flow through the transistor device when a voltage is applied between the drain and source terminals D, S. In the vertical transistor device shown in FIG. 1, a current flow direction substantially corresponds to a vertical direction of the semiconductor body 100. The transistor device is in an off-state, when the conducting channel along the gate dielectric 22 is interrupted, and when a voltage is applied between the drain and source terminals D, S that reverse biases a pn-junction between the drift region 11 and the body region 12. In an n-type transistor device, a voltage that reverse biases the pn-junction is a positive voltage between the drain terminal D and a source terminal S.

In the off-state, a space charge region expands in the drift region 11 beginning at the pn-junction between the drift region 11 and the body region 12. This space charge region is associated with ionized charge carriers in the drift region 11, and the body region 12 on both sides of the pn-junction. A width of this space charge region, which is a dimension of the space charge region in a direction perpendicular to the pn-junction, is dependent on the voltage that reverse biases the pn-junction. This width of the space charge region increases as the reverse biasing voltage increases. The space charge region is associated with an electrical field, wherein a voltage blocking capability of the semiconductor device is reached, when the electrical field generated by ionized dopant atoms in a drift region 11, and by corresponding counter-charges in the drift region 12 reaches the critical electrical field. The critical electrical field is a material constant of the semiconductor material of the semiconductor body 100, such as silicon.

In a transistor device without a field electrode, the reverse biasing voltage at which the critical electrical field is reached at the pn-junction is dependent on the doping concentration of the drift region 11 and is, therefore, dependent on the number of dopant atoms that can be ionized when a reverse biasing voltage is applied to the pn-junction. However, in the semiconductor device shown in FIG. 1, ionized dopant atoms in the drift region 11 do not only find corresponding counter charges in the body region 12, but also in the field electrode 31 that is coupled to the source electrode S. That is, there is also a space charge region (depletion region) in the drift region 11 along the field electrode dielectric 32. Thus, in the semiconductor device shown in FIG. 1, a doping concentration of the drift region 11 can be increased as compared to a transistor device without a field electrode, so as to decrease an on-resistance without decreasing a voltage blocking capability.

Since the field electrode 31 and the body region 12 are electrically connected to the source terminal S, a voltage across the field electrode dielectric 32 between the body region 12 and the field electrode 31 is at or close to zero, so that the field electrode dielectric 32 can be implemented with a smaller thickness adjacent the body region 12 than adjacent the drift region 11. In the drift region 11, there is a voltage across the field electrode dielectric 32 between the field electrode 31 and the drift region 11 when the transistor device is in the off-state.

Implementing the field electrode arrangement with a reduced size (a reduced width) adjacent the body region 12 provides enough space for the gate electrode 21 and the body region 12 in a region close to the first surface 101 of the semiconductor body 100, even in the cases in which a small distance between two neighboring field electrode arrangements is desired in order to increase an overall number of transistor cells that can be implemented in a given area of the semiconductor body 100.

Referring to FIG. 1, the source electrode 41 is electrically connected to the source regions 13, and the field electrodes 31 of the individual transistor cells. In the embodiment shown in FIG. 1, an upper end of the field electrode 31, which is an end facing the first surface 101, is below the first surface 101. The source electrode 41 includes a contact plug 42 that extends down to the field electrode 31 and is electrically connected to the field electrode 31 at a face side. The contact plug 42 further includes a sidewall, and is electrically connected to the body region 12 at the sidewall. Optionally, the body region 12 includes a contact region 16 that is higher doped than other regions of the body region 12, and that provides for an ohmic contact between the source electrode 41 and the body region 12. In this way, the field electrode 31, and the body region 12 can be electrically connected to the source electrode 41 in a space saving manner.

A low gate-source capacitance can be obtained by forming the gate electrode such that an upper end of the gate electrode 21, which is an end facing the first surface 101, is below the first surface 101. Thus, there is only a small overlap between the source region 13, and the gate electrode 21, so that there is a low gate-source capacitance.

Figure 2:
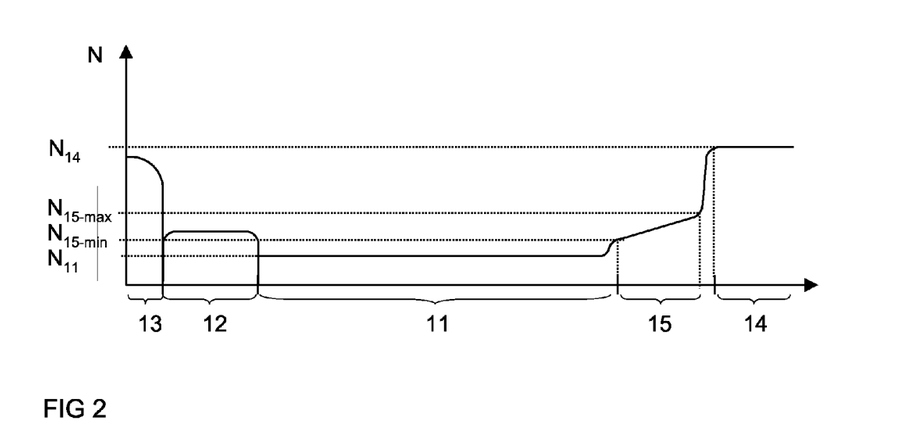
FIG. 2 shows one embodiment of a doping profile of the transistor device shown in FIG. 1.

The field stop region 15 helps to increase a robustness of the transistor device in the case of avalanche breakdown. FIG. 2 schematically illustrates a doping profile of the transistor device along a line I-I that goes through the source region 13, the body region 12, the drift region 11, the field stop region 15, and the drain region 14. For the purpose of explanation, the drain region 14 has the same doping type as the drift region 11 and the field stop region 15. A doping concentration of the source region 13 is, for example, between $1 \times 10^{19}$ cm$^{-3}$ and $1 \times 10^{21}$ cm$^{-3}$, a doping concentration of the body region 12 is, for example, between $1 \times 10^{16}$ cm$^{-3}$ and $1 \times 10^{18}$ cm$^{-3}$. A doping concentration of the drift region 11 is, for example, between $1 \times 10^{14}$ cm$^{-3}$ and $1 \times 10^{16}$ cm$^{-3}$. The doping concentration of the drain region 14 is, for example, between $1 \times 10^{19}$ cm$^{-3}$ and $1 \times 10^{21}$ cm$^{-3}$. According to one embodiment, a doping concentration of the drift region 11 between the body region 12 and the field stop region 15 is substantially constant.

Referring to FIG. 2, the field-stop region 15 has a maximum doping concentration $N_{15-max}$ that is lower than a (maximum) doping concentration $N_{14}$ of the drain region 14 and higher than a doping concentration of the drift region 11. According to one embodiment, the maximum doping concentration $N_{15-max}$ of the field-stop region 15 is between $3 \times 10^{16}$ cm$^{-3}$ and $5 \times 10^{17}$ cm$^{-3}$. According to one embodiment, the maximum doping concentration $N_{15-max}$ of the field-stop region 15 is between 3 times and 50 times the doping concentration of the drift region 11 and, in particular, between 4 times and 40 times the doping concentration of the drift region 11.

A minimum doping concentration $N_{15-min}$ of the field-stop region is below 30%, or even below 10%, of the maximum doping concentration $N_{15-max}$. According to one embodiment, a position where the field-stop region 15 has the maximum doping concentration $N_{15-max}$ is closer to the drain region 14 than to the drift region 11, and the doping concentration decreases continuously from the position with the maximum doping concentration $N_{15-max}$ towards the position with the minimum doping concentration $N_{15-min}$. According to one embodiment, a (shortest) distance between the position with the maximum doping concentration $N_{15-max}$, and a position with the minimum doping concentration $N_{15-min}$ is between 1 micrometer and 10 micrometer, in particular between 1 micrometer and 5 micrometer. This distance corresponds to a width of the field-stop region 15.

Referring to FIG. 2, there is a first transition region between the drift region 11 and the field-stop region 15, and a second transition region between the field-stop region 15 and the drain region 14. In the first transition region, the doping concentration increases from the doping concentration of the drift region 11 to the minimum doping concentration $N_{15-min}$ of the field-stop region 15 (if this minimum doping concentration $N_{15-min}$ is higher than the doping concentration of the drift region 11. That is, there is only a first transition region if the minimum doping concentration $N_{15-min}$ is higher than the doping concentration of the drift region 11). According to one embodiment, the minimum doping concentration $N_{15-min}$ of the field stop region 15 corresponds to the doping concentration of the drift region 11. According to another embodiment, the minimum doping concentration $N_{15-min}$ of the field stop region 15 is higher than the doping concentration of the drift region 11 (but lower than 30% or lower than 10% of the maximum doping concentration $N_{15-max}$). In the second transition region, the doping concentration increases from the maximum doping concentration $N_{15-max}$ of the field-stop region 15 to the doping concentration of the drain region 14. According to one embodiment, a maximum gradient of the doping concentration in at least one of the first and second transition regions is higher than a gradient of the doping concentration in the field-stop region 15.

Referring to FIG. 1, the source electrode 41 can be implemented as a planar electrode that is arranged above the source region 11, the field electrode 31, and also the gate electrode 21, wherein the gate electrode 21 is electrically insulated from the source electrode 41 by an insulation layer 23.

Figure 3:
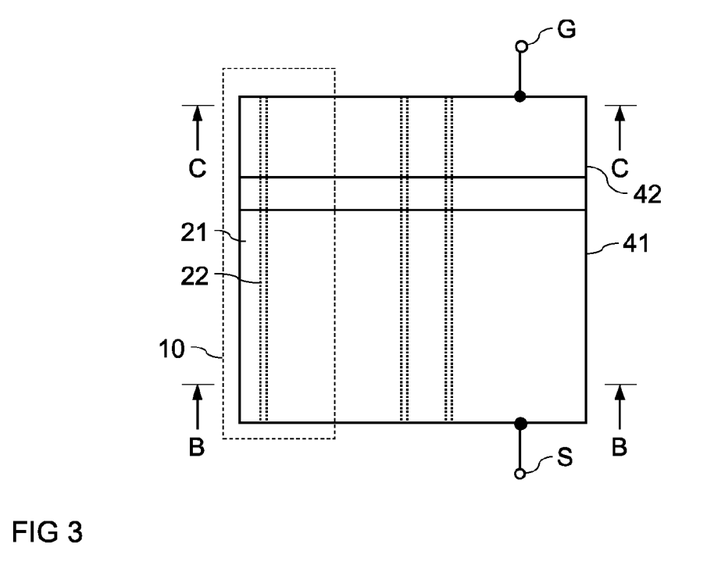
FIG. 3 shows a top view on the semiconductor device shown in FIG. 1.

FIG. 3 shows a top view of the transistor device shown in FIG. 1. In this embodiment, the individual transistor cells 10 are implemented as elongated transistor cells. That is, the source region 13, the body region 12, the gate electrode 21 with the gate dielectric 22, and the field electrode 31 with the field electrode dielectric 32 are elongated in a horizontal direction of the semiconductor body 100, wherein the elongated device structures of the individual transistor cells 10 are substantially parallel. In the top view shown in FIG. 3, the position and geometry of the gate electrode 21 and the gate electrode dielectric 22 is schematically illustrated in dotted lines. FIG. 3 shows the source electrode 41 (that can also be referred to as source pad), and a gate pad 42 spaced apart from the source pad 41. The gate pad 42 is electrically connected to the gate electrodes 21 of the individual transistor cells.

Figure 4:
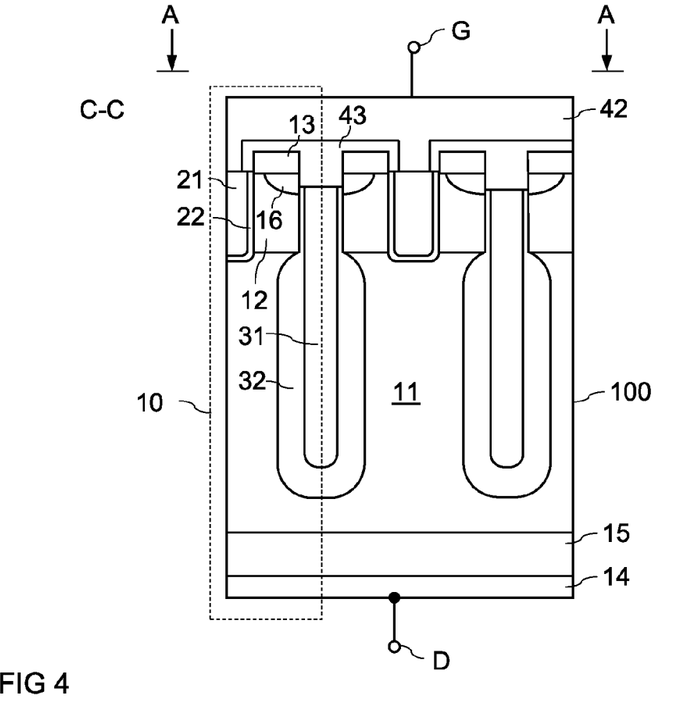
FIG. 4 shows a vertical cross sectional view of the transistor device shown in FIG. 1 in another vertical section plane.

FIG. 4 shows a vertical cross sectional view of the semiconductor body 100 in a vertical section plane C-C that goes through the gate pad 42. Referring to FIG. 4, the source regions 13 are dielectrically insulated from the gate pad 42 by an insulation layer 43, and the gate pad 42 is electrically connected to the gate electrodes 21 of the individual transistor cells. The source pad 41 and the gate pad 42 are spaced apart in a direction corresponding to the longitudinal directions of the individual transistor cells, that is in the longitudinal directions of the gate electrode 21, the field electrode 31, and so on. Optionally, an insulation layer (not shown) is arranged between the source pad 41 and the gate pad 42.

Figure 5:
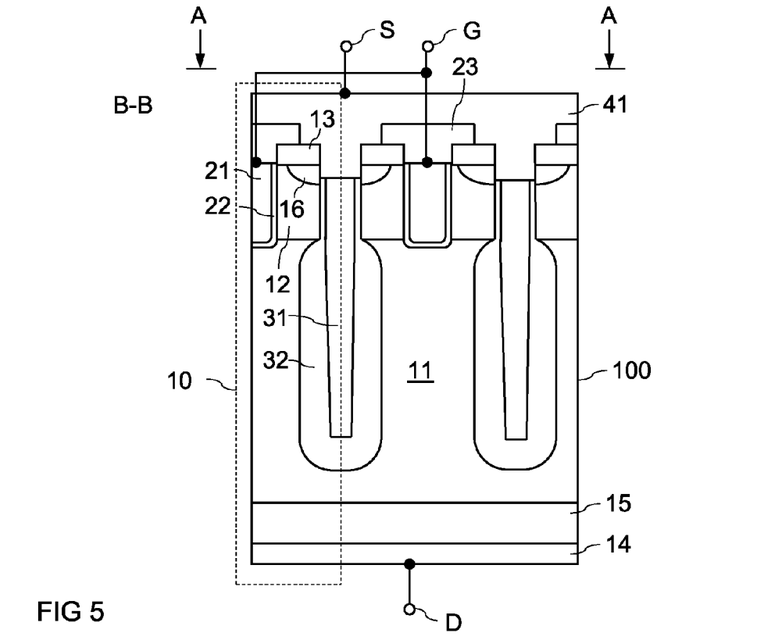
FIG. 5 shows a vertical cross sectional view of a transistor device according to another embodiment.

FIG. 5 shows a vertical cross sectional view of a transistor device according to another embodiment. This transistor device is different from the transistor device explained with reference to FIGS. 1-4 hereinbefore in that a width of the field electrode 31 decreases in a direction facing away from the body region 12, and a thickness of the field electrode dielectric 32 increases in this direction. In this direction, i.e. in the direction of the drain region 14, a voltage across the field electrode dielectric 32 increases when the transistor device is in the off-state. The increase of the thickness of the field electrode dielectric 32 results in an increased dielectric strength of the field electrode dielectric 32 which may be necessary to withstand the voltage across the field electrode dielectric 32 in the off-state.

Figure 6:
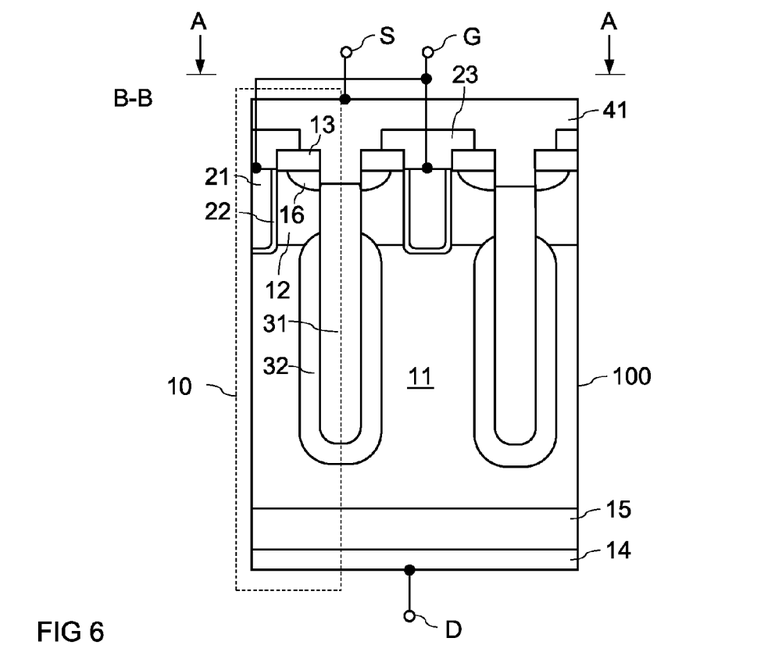
FIG. 6 shows a vertical cross sectional view of a transistor device according to yet another embodiment.

FIG. 6 shows a vertical cross sectional view of a transistor device according to a further embodiment. This embodiment is different from the embodiment as explained hereinbefore in that the field electrode 31 adjoins the body region 12 and the contact region 16, respectively. A section of the field electrode dielectric 31 may extend into the body region 12 beyond the pn-junction between the body region 12 and the drift region 11. However, it is also possible for the field electrode dielectric 32 to end at the pn-junction. In this embodiment, those sections of the field electrode 31 that adjoin the body region 12 connect the body region 12 to the source electrode 41. In the embodiment shown in FIG. 6, a border between the source electrode 41 and the field electrode 31 is in a region of the contact region 16. However, it is also possible for the source electrode 41 to extend in deeper into the body region 12 than the contact region 14, or it is possible for the field electrode 31 to extend to the source region 13, or even to the first surface 101.

According to one embodiment, the field electrode 31 and the source electrode 41 include different materials. According to another embodiment, the field electrode and the source electrode 41 include the same material. Suitable materials for the field electrode 31 and the source electrode 41 are, for example, a metal or a highly doped polycrystalline semiconductor material, such as highly doped polysilicon.

Figure 7A:
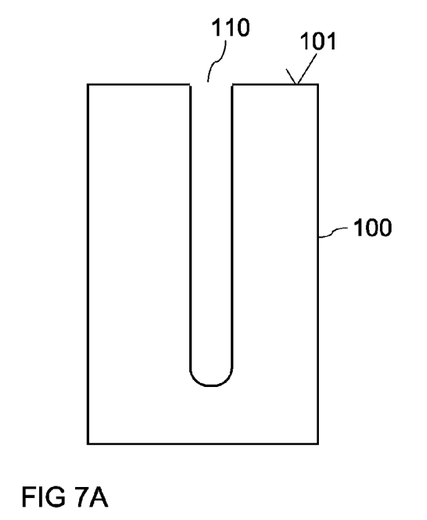
FIGS. 7A-7F show one embodiment of a method for producing a field electrode structure of a transistor device.
Figure 7B:
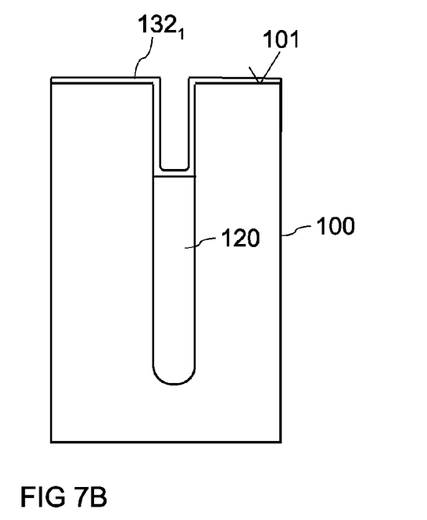
Figure 7C:
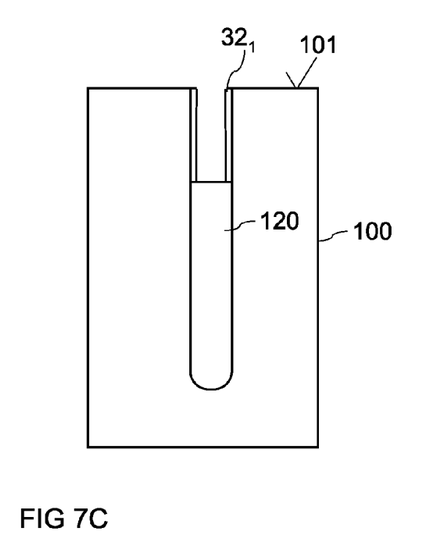
Figure 7D:
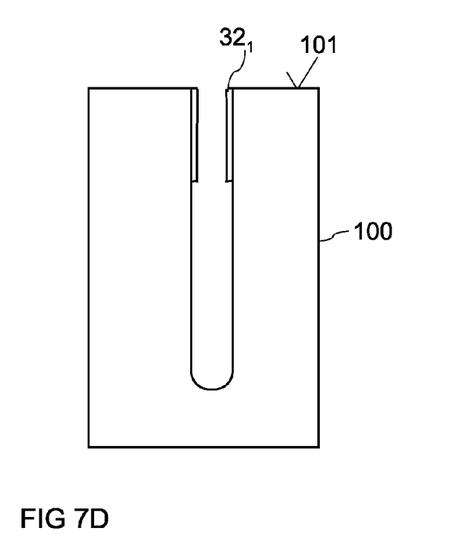

FIGS. 7A-7F show vertical cross sectional views of the semiconductor body 100 during (after) method steps of a method according to one embodiment for forming the field electrode arrangement 30. Referring to FIG. 7A, the method includes forming a trench 110 in the first surface 101 of the semiconductor body 100. Referring to FIG. 7D, the method further includes forming a protection layer $32_1$ on sidewalls in an upper section of the trench 110. "An upper section" of the trench 110 is a section of the trench in the region of the first surface 101. Referring to FIGS. 7B and 7C, forming the protection layer $32_1$ in the upper region of the trench 110 may include filling a lower section of the trench 110 with a filling material 120 forming a protection layer $132_1$ on a bottom, and sidewalls of a residual trench 111, and on the first surface 101 (see FIG. 7B). The filling material may include at least one of an oxide, a resist, and carbon. Referring to FIG. 7C, forming the protection layer $32_1$ on the sidewalls in the upper trench section may further include removing the protection layer $132_1$ from the first surface 101 and from the bottom of the residual trench 111. This removal may include an anisotropic etching process. Finally, the filling material 120 is removed from the lower trench section. This removal may, for example, include an etching process that etches the filling material 120 selectively relative to the protection layer $32_1$ and the material of the semiconductor body 100.

Figure 7E:
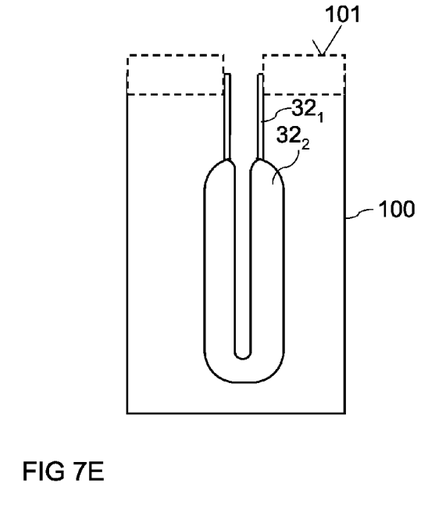

Referring to FIG. 7E, the method further includes forming a dielectric layer $32_2$ on sidewalls uncovered in the lower trench section. Forming this dielectric layer $32_2$ may include a thermal oxidation process that oxidizes the semiconductor material of the semiconductor body 100 along those uncovered sidewalls and the bottom of the trench 110. The protection layer $32_1$ prevents the sidewalls in the upper trench section from being oxidized during this process. According to one embodiment, the protection layer $32_1$ includes a nitride, such as silicon nitride. Oxidizing uncovered sidewall sections of the trench may also include oxidizing the first surface 101 of the semiconductor body. A corresponding oxide layer 33 (illustrated in dashed lines) along the first surface 101 is shown in FIG. 7E (and FIG. 7F).

Figure 7F:
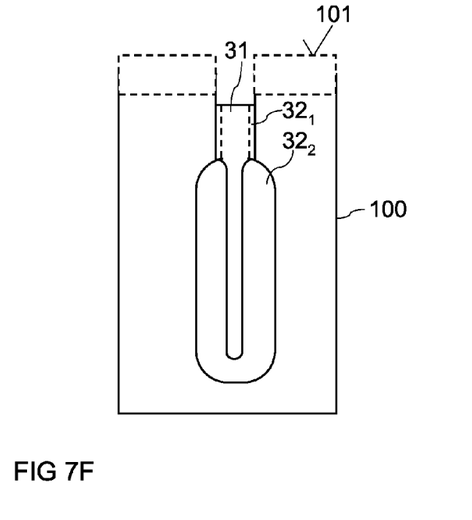

Referring to FIG. 7F, the method further includes forming the field electrode 31 in a residual trench remaining after forming the dielectric layer $32_2$. The protection layer $32_1$ may remain and may form a section of the field electrode dielectric 32, or the protection layer $32_1$ may be removed from the side walls in the upper trench section before forming the field electrode 31. This is why the protection layer $32_1$ is illustrated in dashed lines in FIG. 7F.

Referring to FIG. 7F, the field electrode 31 can be formed such that an upper end of the field electrode 31 is below the first surface 101. In this case, there is a trench above the field electrode 31 and the optional protection layer $32_1$. This trench is finally filled by the plug 42 of the source electrode 41. Forming the field electrode 31 may include a deposition process in which a field electrode material, such as a metal or a highly doped polycrystalline material, such as polysilicon, is deposited in the residual trench. The residual trench may be completely filled with the field electrode material, and the field electrode material may then be removed from a section close to the surface 101, so as to form the trench above the field electrode 31. Removing the electrode material in order to form the trench may include an etching process.

In the deposition process, the electrode material may also be deposited above the first surface 101. The electrode material above the surface 101 can be removed in the etching process that etches the trench above the field electrode 31, or can be removed using a CMP (Chemical Mechanical Polishing) process before the etching process. The oxide layer on the first surface 101 can be removed before or after depositing the electrode material.

Figure 8:
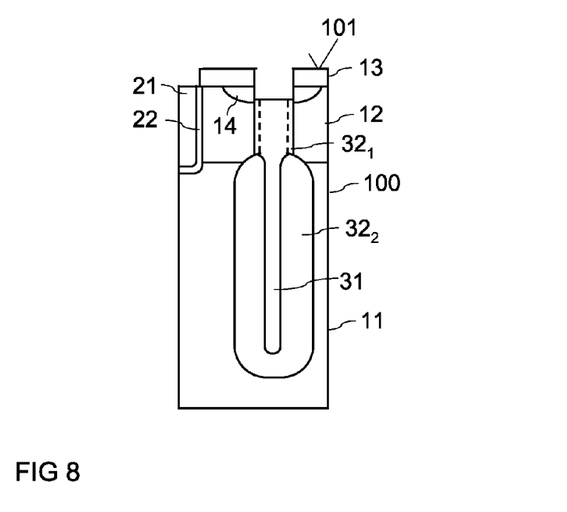
FIG. 8 shows the device topology shown in FIG. 7F after further method steps.

FIG. 8 shows the device structure shown in FIG. 7F after further method steps that include forming the body region 12, the source region 13, the contact region 16, the gate electrode 21, and the gate dielectric 22. Forming the doped semiconductor device regions may include at least one of an implantation, and a diffusion process.

Forming one of the transistor devices explained with reference to FIGS. 1-6 hereinbefore further includes forming the gate electrode 21 and the gate dielectric 22. This may include forming a further trench, forming the gate dielectric 22 on sidewalls and a bottom of the trench, and forming the gate electrode 21 on the gate dielectric 22. The gate dielectric 22 is, for example, an oxide, and the gate electrode 21 includes, for example, a metal or a highly doped polycrystalline semiconductor material. Of course, the method steps explained hereinbefore can be performed in an order different from the order explained hereinbefore.

In the method explained with reference to FIGS. 7A-7F and FIG. 8, the field electrode arrangement 30, the gate dielectric 22, and gate electrode 21 are formed in separate method steps, so that the properties of the field electrode arrangement 30 and the properties of the gate electrode and the gate dielectric 22 can be adjusted completely independent of each other.

Figure 9A:
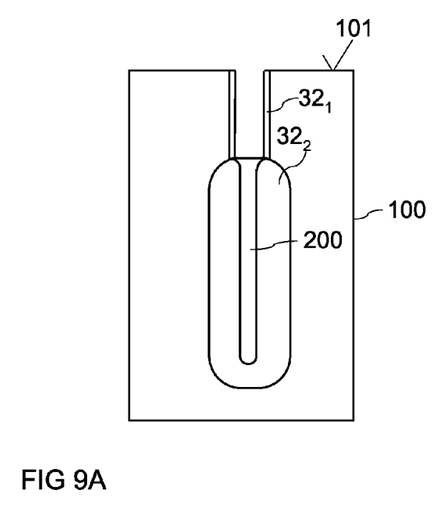
FIG. 9A-9C illustrate method steps for forming a field electrode of a field electrode arrangement according to one embodiment.
Figure 9B:
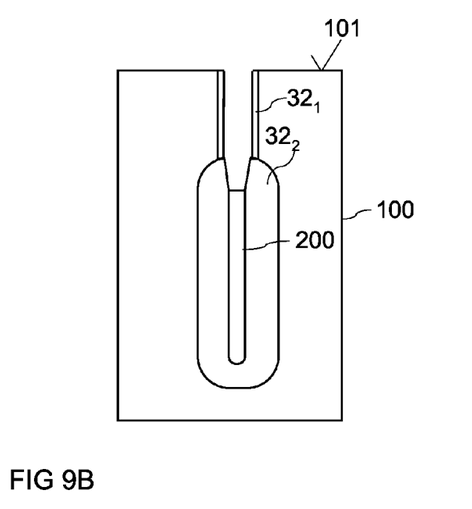
Figure 9C:
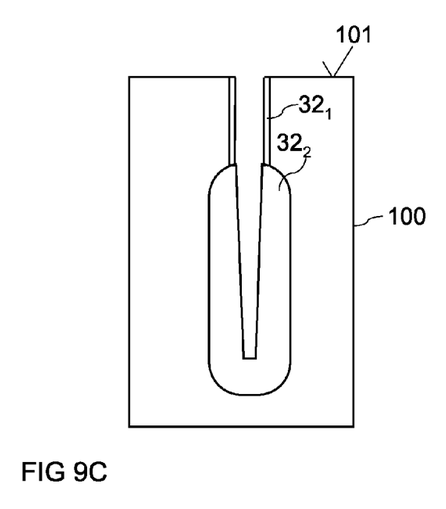

FIGS. 9A-9C depict one embodiment of a method for forming a tapered field electrode 31. The method steps explained with reference to FIGS. 9A-9C are based on the device structure illustrated in FIG. 7E. Referring to FIG. 9A, the trench 110 is filled with a mask layer 200 at least in the lower trench section where the dielectric layer 32$_2$ has been produced. According to one embodiment, the mask layer is a resist. Referring to FIGS. 9B and 9C the mask layer 200 and the dielectric layer 32$_2$ are etched in an etching process that uses an etchant that etches both, the mask layer 200, and the dielectric layer 32$_2$, but that etches the mask layer 200 faster than the dielectric layer 32$_2$. According to one embodiment, the etchant etches the mask layer 200 ten times to twenty times faster than the dielectric layer 32$_2$. That is, an etch selectivity of this etchant is, for example, between 10:1 and 20:2. FIG. 9B shows the device structure during the etching process, and FIG. 9C shows the device structure after the etching process. At the end of this process, the trench 110 has tapered side walls along the dielectric layer 32$_2$. This is due to the fact that side wall sections of the dielectric layer 32$_2$ closer to the first surface 101 are etched longer than those side wall sections that are more distant to the first surface 101. After the tapered trench has been produced, the method steps explained with reference to FIG. 7F that produce the field electrode 31 can be performed.

In the description hereinbefore, directional terminology, such as "top," "bottom," "front," "back," "leading," "trailing" etc., is used with reference to the orientation of the figures being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Although various exemplary embodiments of the invention have been disclosed, it will be apparent to those skilled in the art that various changes and modifications can be made which will achieve some of the advantages of the invention without departing from the spirit and scope of the invention. It will be obvious to those reasonably skilled in the art that other components performing the same functions may be suitably substituted. It should be mentioned that features explained with reference to a specific figure may be combined with features of other figures, even in those cases in which this has not explicitly been mentioned. Further, the methods of the invention may be achieved in either all software implementations, using the appropriate processor instructions, or in hybrid implementations that utilize a combination of hardware logic and software logic to achieve the same results. Such modifications to the inventive concept are intended to be covered by the appended claims.

As used herein, the terms "having," "containing," "including," "comprising" and the like are open ended terms that indicate the presence of stated elements or features, but do not preclude additional elements or features. The articles "a," "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

It is to be understood that the features of the various embodiments described herein may be combined with each other, unless specifically noted otherwise.

The invention claimed is:

1. A transistor device, comprising:
a source region, a drift region, and a body region arranged between the source region and the drift region;
a gate electrode adjacent to the body region, and dielectrically insulated from the body region by a gate dielectric; and
a field electrode structure comprising a field electrode and a field electrode dielectric, the field electrode structure being adjacent to the drift region and the body region and spaced apart from the gate electrode in a first direction that is perpendicular to a vertical direction in which the source region and the drift region are spaced apart,
wherein the field electrode dielectric dielectrically insulates the field electrode at least from the drift region,
wherein the field electrode structure has a first width adjacent the drift region, and a second width adjacent the body region, and
wherein the first width is larger than the second width.

2. The transistor device of claim 1, wherein the second width is less than 60% of the first width.

3. The transistor device of claim 1, wherein the field electrode dielectric has a first thickness adjacent the drift region and a second thickness adjacent the body region, and wherein the first thickness is greater than the second thickness.

4. The transistor device of claim 1, further comprising:
a drain region; and
a field stop region arranged between the drift region and the drain region, wherein the field stop region has a higher doping concentration than the drift region and a lower doping concentration than the drain region.

5. The transistor device of claim 4, wherein the doping concentration of the field stop region is between 5 times and 20 times the doping concentration of the drift region.

6. The transistor device of claim 1, further comprising:
a source electrode electrically coupled to the source region, the body region, and the field electrode.

7. The transistor device of claim 6,
wherein the source electrode comprises a contact plug with a front end and a sidewall,
wherein the front end contacts the field electrode (31), and
wherein the sidewall contacts the body region.

8. The transistor device of claim 7,
wherein the body region comprises a contact region that adjoins the contact plug and is more highly doped than a region the body region that adjoins the gate dielectric.

9. The transistor device of claim 1, wherein the first width is measured between opposing interfaces of the field electrode dielectric and the drift region, and wherein the second width is measured between opposing interfaces of the field electrode dielectric and the body region.

10. The transistor device of claim 1, wherein the field electrode dielectric extends deeper into the drift region than the gate dielectric.

* * * * *